US008921187B2

(12) United States Patent
Chen et al.

(10) Patent No.: US 8,921,187 B2
(45) Date of Patent: Dec. 30, 2014

(54) PROCESS TO ELIMINATE LAG IN PIXELS HAVING A PLASMA-DOPED PINNING LAYER

(71) Applicant: OmniVision Technologies, Inc., Santa Clara, CA (US)

(72) Inventors: Gang Chen, San Jose, CA (US); Duli Mao, Sunnyvale, CA (US); Hsin-Chih Tai, San Jose, CA (US); Vincent Venezia, Los Gatos, CA (US); Yin Qian, Milpitas, CA (US); Howard E. Rhodes, San Martin, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 27 days.

(21) Appl. No.: 13/777,197

(22) Filed: Feb. 26, 2013

(65) Prior Publication Data
US 2014/0239351 A1    Aug. 28, 2014

(51) Int. Cl.
*H01L 27/148*    (2006.01)
*H01L 27/146*    (2006.01)

(52) U.S. Cl.
CPC .... *H01L 27/14689* (2013.01); *H01L 27/14643* (2013.01)
USPC ................. 438/286; 438/57; 438/59; 438/60; 257/460; 257/E27.133

(58) Field of Classification Search
USPC ..................... 257/225, 228; 438/60
See application file for complete search history.

(56) References Cited

U.S. PATENT DOCUMENTS

| 4,454,526 | A | 6/1984 | Nishizawa et al. | |
|---|---|---|---|---|
| 4,545,526 | A | 10/1985 | Ido et al. | |
| 7,459,360 | B2 * | 12/2008 | Adkisson et al. | 438/199 |
| 7,741,666 | B2 | 6/2010 | Nozaki et al. | |
| 2008/0057701 | A1 * | 3/2008 | Engbrecht et al. | 438/624 |
| 2008/0179639 | A1 * | 7/2008 | Gambino et al. | 257/291 |
| 2009/0124038 | A1 | 5/2009 | Tuttle | |
| 2009/0200587 | A1 | 8/2009 | Venezia et al. | |
| 2009/0302358 | A1 * | 12/2009 | Mao et al. | 257/292 |
| 2012/0080765 | A1 | 4/2012 | Ku et al. | |

OTHER PUBLICATIONS

Baek et al. (Ultrashallow P+/N Junction Formation by Plasma Ion Implantation. Journal of the Korean Physical Society, vol. 37, No. 6, Dec. 2000, pp. 912-914).*

(Continued)

*Primary Examiner* — Cheung Lee
*Assistant Examiner* — Stephen Bradley
(74) *Attorney, Agent, or Firm* — Blakely Sokoloff Taylor & Zafman LLP

(57) ABSTRACT

Embodiments of a process including depositing a sacrificial layer on the surface of a substrate over a photosensitive region, over the top surface of a transfer gate, and over at least the sidewall of the transfer gate closest to the photosensitive region, the sacrificial layer having a selected thickness. A layer of photoresist is deposited over the sacrificial layer, which is patterned and etched to expose the surface of the substrate over the photosensitive region and at least part of the transfer gate top surface, leaving a sacrificial spacer on the sidewall of the transfer gate closest to the photosensitive region. The substrate is plasma doped to form a pinning layer between the photosensitive region and the surface of the substrate. The spacing between the pinning layer and the sidewall of the transfer gate substantially corresponds to a thickness of the sacrificial spacer. Other embodiments are disclosed and claimed.

14 Claims, 5 Drawing Sheets

(56) References Cited

OTHER PUBLICATIONS

Chang-Rok Moon et al., "Application of Plasma-Doping (PLAD) Technique to Reduce Dark Current of CMOS Image Sensors," IEEE Electron Device Letters, vol. 28, No. 2, Feb. 2007, pp. 114-116.

S. K. Baek et al., "Ultrashallow P+/N Junction Formation by Plasma Ion Implantation," Journal of Korean Physical Society, vol. 37, No. 6, Dec. 2000, pp. 912-914.

* cited by examiner

PROCESS TO ELIMINATE LAG IN PIXELS HAVING A PLASMA-DOPED PINNING LAYER

TECHNICAL FIELD

The described embodiments relate generally to image sensors and in particular, but not exclusively, to an image sensor including a plasma-doped pinning layer.

BACKGROUND

Image sensors are widely used in digital still cameras, cellular phones, security cameras, medical, automobile, and other applications. Complementary metal-oxide-semiconductor ("CMOS") technology is used to manufacture low-cost image sensors on silicon substrates. In a large number of image sensors, a photodiode structure called a pinned photodiode is used because of its low-noise performance.

In these photodiode structures, a P+ type doped pinning layer is ion-implanted at or just below the silicon surface adjacent to a transfer gate. An N-type photosensitive region is ion-implanted deeper into a P-type doped silicon substrate, also adjacent to the transfer gate. The N-type doped layer is the buried layer that stores charge away from the surface region where defects typically reside. The purpose of the P+ type pinning layer is to passivate the defects on the photodiode surface. The relative location of the edges of the P+ type doped pinning layer, the N-type doped photosensitive region, and the adjacent transfer gate should be carefully engineered to improve photodiode charge transfer through the transfer gate. This becomes increasingly important as CMOS image sensors ("CIS") continue to be miniaturized.

As CIS continue to miniaturize, the area of their pixels and principally their photosensitive regions shrink. This results in less capacity of each pixel to intercept light and hold photo-generated charge. Additionally, as backside illuminated ("BSI") image sensors are introduced their thinned substrates put further constraints on photo-generated charge, especially for longer wavelength light, which can pass through a silicon substrate without being fully absorbed. Although the advance of manufacturing technology facilitates the decrease in minimum allowable CMOS sizes, the reduction of variability of shape placement (i.e., alignment tolerance) has progressed at a slower rate. Image lag often depends on consistent alignment tolerances between the N-type doped photosensitive region, the P+ type pinning layer, and the adjacent transfer gate edge.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified. Figures are not to scale unless specifically indicated.

DETAILED DESCRIPTION OF THE ILLUSTRATED EMBODIMENTS

Embodiments of a pixel and a process to fabricate a pixel having improved image lag, noise, and long wavelength sensitivity characteristics are described herein.

In the following description numerous specific details are set forth to provide a thorough understanding of the embodiments. Reference throughout this specification to "one embodiment" or "an embodiment" means that a particular feature, structure, or characteristic described in connection with the embodiment is included in at least one described embodiment. Thus, the appearance in the description of the phrases "in one embodiment" or "in an embodiment" do not necessarily all refer to the same embodiment. Furthermore, the particular features, structures, or characteristics may be combined in any suitable manner in one or more embodiments.

Figure 1A:
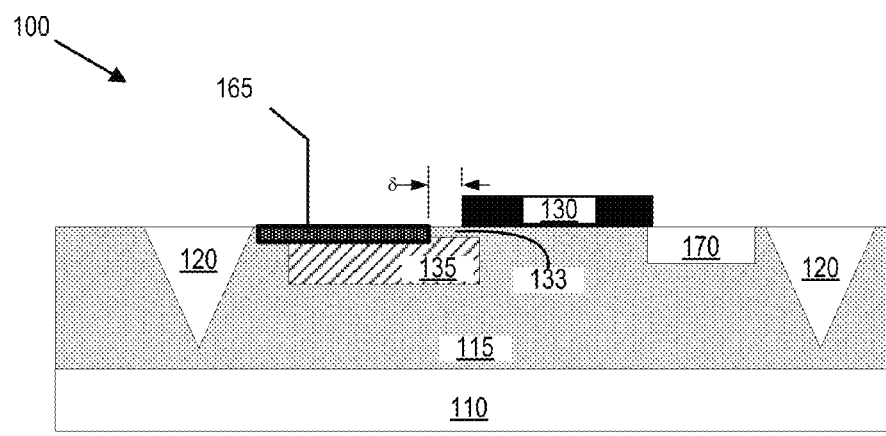
FIG. 1A is a cross-section of an embodiment of a pixel including a pinned photodiode.

FIG. 1A illustrates an embodiment of a CMOS pixel 100 including pinned photodiode. The pinned photodiode is formed within pixel 100 using dopant ions implanted at different angles with respect to the substrate surface. Substrate 110 can be a p+ type doped silicon layer having formed upon it an epitaxially grown silicon layer (epi layer) 115 which may be lightly p type doped. Shallow Trench Isolation (STI) regions 120 are formed within epi layer 115 to electrically isolate adjacent image sensor pixels. Before ion-implanting photodiode elements, transfer transistor gate 130 is formed for the purpose of transferring out from the pinned photodiode the photo generated carriers (signal charge) that are accumulated and held within the pinned photodiode during exposure to scene illumination.

Figure 1B:
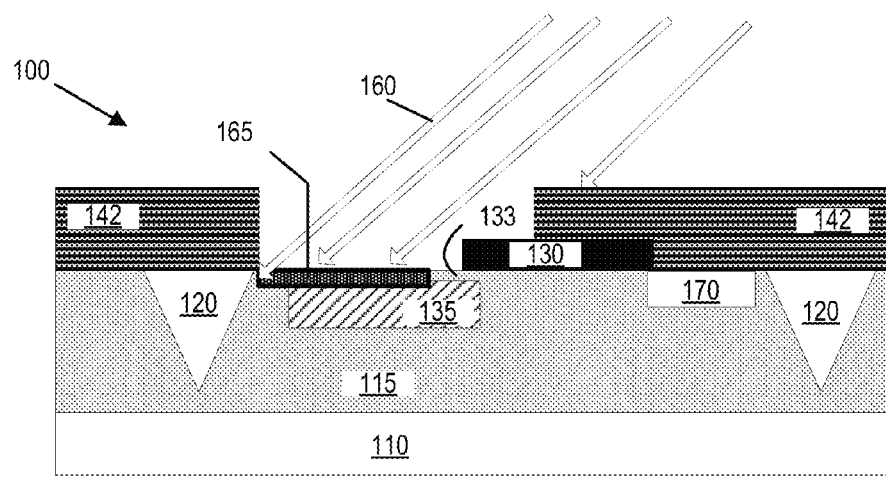
FIG. 1B is a cross-section of an embodiment of a pixel illustrating an embodiment of a process for forming a pinning layer.

FIG. 1B illustrates the formation of pinning layer 165. One edge of transfer gate 130 provides an ion implant masking function that allows the elements of the pinned photodiode to be aligned. Photosensitive region 135 (cathode) is first formed by ion implanting n type dopant ions, such as Phosphorus or Arsenic, at an angle relative to the exposed vertical edge of transfer gate 130 such that the dopant ions can be placed a short distance under transfer gate 130. These dopant ions can have high implantation energy and thereby penetrate deeper into epi layer 115 to form photosensitive region 135.

After photosensitive region 135 is formed, a photoresist mask 142 is formed such that transfer gate 130 is partially exposed. It is preferable that the entire periphery of dopant region 135 at the surface of epi layer 115 also be exposed. Pinning layer or pinning region 165 (anode) is then formed by ion-implanting p-type dopant ions 160, such as Boron or Indium, at an angle relative to the exposed vertical edge of transfer gate 130. Dopant ions 160 are shadowed by transfer gate 130 and thereby excluded from a small region 133 above photosensitive region 135 and adjacent to the edge of transfer gate 130. Ion implant dopant ions 160 can have low implantation energy and only penetrate to a shallow level within epi layer 115 to form pinning layer 165.

Alignment and separation of the edges of dopant regions 135 and 165 is an important performance factor for image sensor pixels 100. One such performance factor is the dependence of image lag on the alignment of pinning layer 165 to photosensitive region 135 and the edge of transfer gate 130. The alignment of pinning layer 165 to photosensitive region 135 is not only important at the transfer gate edge. At all other locations around the periphery of the photodiode it is preferable that pinning layer 165 fully enclose photosensitive region 135, i.e., that dopant region 165 preferably extends beyond the borders of dopant region 135.

In the illustrated method, the alignment and separation depends in part on the thickness of transfer gate 130, as well as the angle and energy of both ion implants. The upper limit on implant energy for dopant ions can be determined by the thickness of gate 130. One way to address this limitation is to add a process compatible layer such as silicon oxide or nitride, on top of transfer gate 130 prior to its formation in order to make it a thicker ion implant mask. In another method that is not shown here, before forming pinning layer 165 a conventional gate spacer is formed on the edge of transfer gate 130. A separate photoresist mask 142 is placed on pixel 100 and dopant ions 160 are ion-implanted. The gate spacer participates in the separation and alignment of the pinned photodiode regions near transfer gate 130 in this method. Both solutions, however, add complexity and cost to a standard CMOS fabrication process.

Additionally, the use of ion implantation introduces crystal defects that leads to dark current and contributes noise to the transferred signal. Furthermore the ion bombardment of the transfer gate can degrade the integrity of the underlying gate oxide. There is an upper limit on the ion implant parameters due to this onset of oxide degradation, which limits flexibility in design of photosensitive region 135.

Figure 2A:
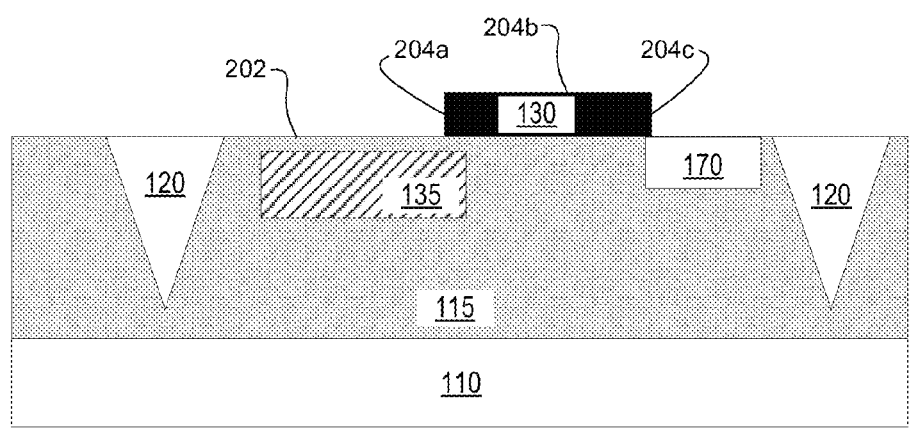
FIGS. 2A-2G are cross-sections illustrating an embodiment of a process for producing a pixel including a pinned photodiode, such as the pixel shown in FIG. 1A

FIGS. 2A-2G together illustrate an embodiment of a process for producing a pixel with a pinned photodiode that is predictably and repeatably spaced from the adjacent transfer gate. FIG. 2A illustrates an initial part of the process, in which various elements of the pixel have already been formed. Photosensitive region 135 is formed below surface 202 of epi layer 115. Transfer gate 130 is formed on surface 202 adjacent to photosensitive region 135, and includes sidewalls 204a and 204c in the top surface 204b. Sidewall 204a is the sidewall closest to photosensitive region 135. In one embodiment, transfer gate 130, or a part of the transfer gate such as top surface 204b, can be previously counter-doped to neutralize or reduce the effect of dopants that will be implanted later during plasma doping (see FIG. 2E). In an embodiment in which the entire transfer gate is counter-doped, the counter-dopants can be implanted in the transfer gate material before formation of the transfer gate. If all or part transfer gate 130 is counter-doped, it is implanted with dopants of a charge type opposite the charge type of the dopants that will be plasma-implanted: if plasma doping will later be used to implant p-type dopants, transfer gate 130 can be counter-doped with n-type dopants and, conversely, if plasma doping will later be used to implant n-type dopants, transfer gate 130 can be counter-doped with p-type dopants. A floating diffusion 170 is formed in epi layer 115 on the side of transfer gate 130 opposite the side of the transfer gate where photosensitive region 135 is formed. Shallow trench isolations (STIs) 120 are formed in epi layer 115.

Figure 2B:
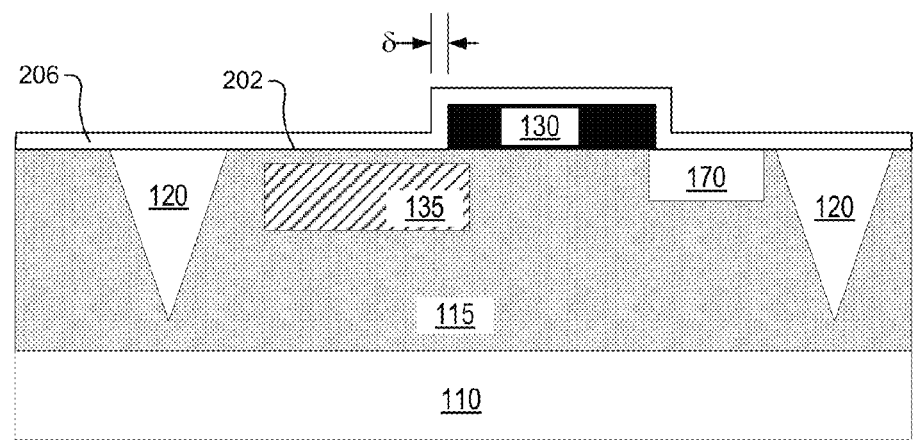

FIG. 2B illustrates a next part of the process. Starting with the buildup shown in FIG. 2A, a sacrificial layer 206 is deposited on substrate surface 202, transfer gate top surface 204b, and transfer gate sidewalls 204a and 204c. Sacrificial layer 206 has a selected thickness δ on sidewall 204a. Thickness δ can be easily controlled and accurately adjusted to any selected thickness. In the illustrated embodiment, sacrificial layer 206 has a uniform thickness on all the surfaces on which it is deposited, but in other embodiments sacrificial layer 206 can have a thickness other than δ on surfaces other than sidewall 204a. For example, in one embodiment sacrificial layer 206 can be spun on, so that the sacrificial layer will be thicker on the substrate than over the transfer gate electrode and will not conform exactly to the shape of the gate electrode. The thickness δ of sacrificial layer 206 on sidewall 204 is selected based on a desired spacing between the transfer gate 130 and the resulting pinning layer of the pinned photodiode.

Sacrificial layer 206 can be any easy-to-remove polymer material. In one embodiment, sacrificial layer 206 is made of a bottom anti-reflective coating (BARC), such as the LH157B chromophoric polymers or any other bottom anti-reflective coating available from Brewer Science of Rolla, Mo. Other embodiments can use any of the bottom anti-reflective coatings available from Honeywell Electronic Materials of Sunnyvale, Calif., such as the DUO193 organosiloxane-based coatings. In other embodiments, the sacrificial layer can be made of other easy-to-remove polymers.

Figure 2C:
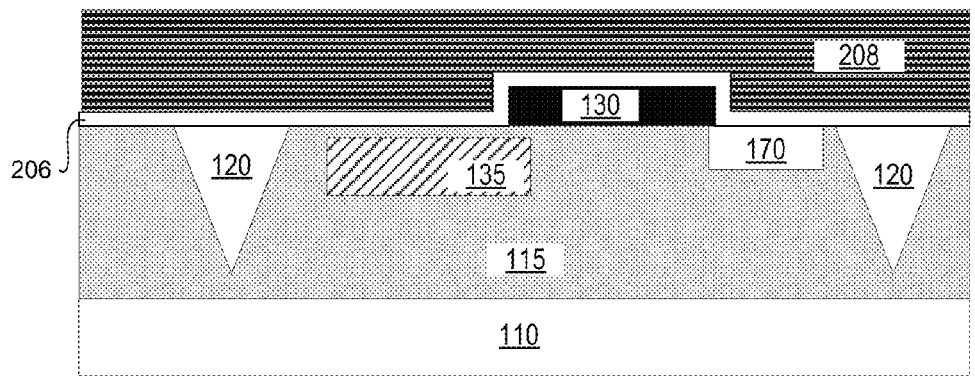
Figure 2D:
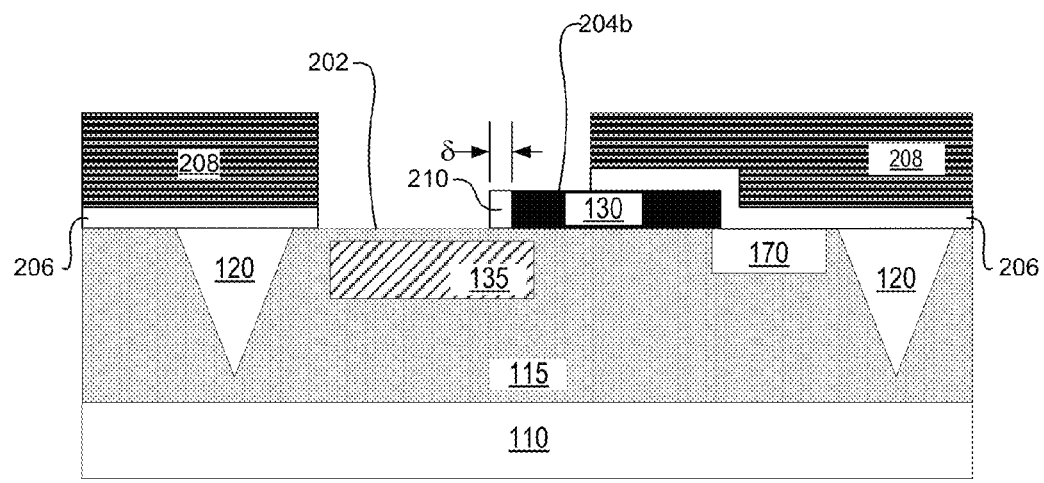

FIGS. 2C-2D illustrate a next part of the process. Starting with the build-up shown in FIG. 2B, in FIG. 2C a layer of photoresist 208 is deposited over substantially all of sacrificial layer 206. In FIG. 2D, after photoresist layer 208 is deposited over sacrificial layer 206 the photoresist is photolithographically patterned and, following patterning, both the photoresist 208 and sacrificial layer 206 are etched to expose the portion of substrate surface 202 that lies substantially over photosensitive region 135, and to expose at least a part of transfer gate top surface 204b. The etch leaves in place a portion of sacrificial layer 206 to form sacrificial spacer 210 on sidewall 204a of transfer gate 130. The thickness δ of sacrificial spacer 210 depends on several things, such as the step height of the transfer gate, the thicknesses of sacrificial layer 206 on top of the substrate and the transfer gate, and the etch. In an embodiment that uses anisotropic etching, after etching sacrificial spacer 210 substantially retains its initial thickness δ. In an embodiment where anisotropic etching is not used, the initial thickness of sacrificial layer 206 on sidewall 204a can be made greater than δ such that the non-anisotropic etching reduces the thickness of sacrificial spacer 210 to substantially δ.

Figure 2E:
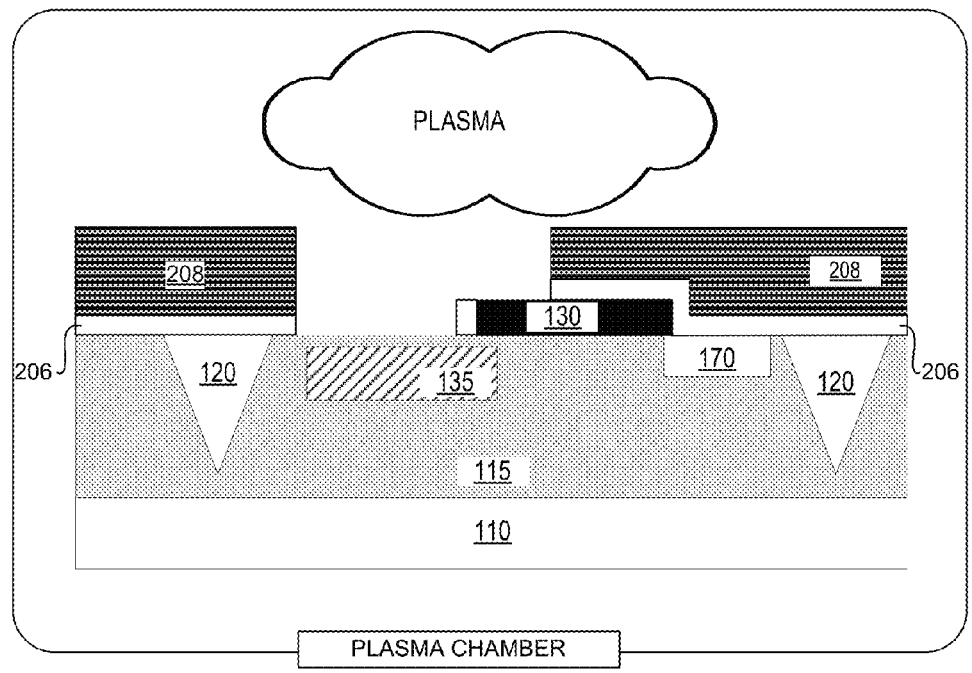

FIG. 2E illustrates a next part of the process. Starting with the buildup shown in FIG. 2D, the entire buildup is placed inside a plasma chamber, so that at least the top part of the buildup will be subject to a plasma doping process such as Plasma Immersion Ion Implantation ("PIII"). In PIII, the surface of p-type epi layer 115 is exposed to a plasma, and a high negative voltage is applied to form an electric field between surface 202 of p-type epi layer 115 and the plasma. The electric field accelerates p-type dopant ions from the plasma towards surface 202 of p-type epi layer, thereby implanting the ions in the epi layer. In one embodiment the p-type dopant ions can be boron, but in other embodiments other types of dopants can be used. Using this process, pinning layer or pinning region 165 is formed in the space between photosensitive region 135 and surface 202 of p-type epi layer 115. Generally, pinning layer 165 has a charge type opposite the charge type of photosensitive region 135: in the illustrated embodiment pinning layer 165 is p-doped while photosensitive region 135 is n-doped, but in an embodiment where photosensitive region 315 is p-doped, pinning layer 165 can be n-doped.

Figure 2F:
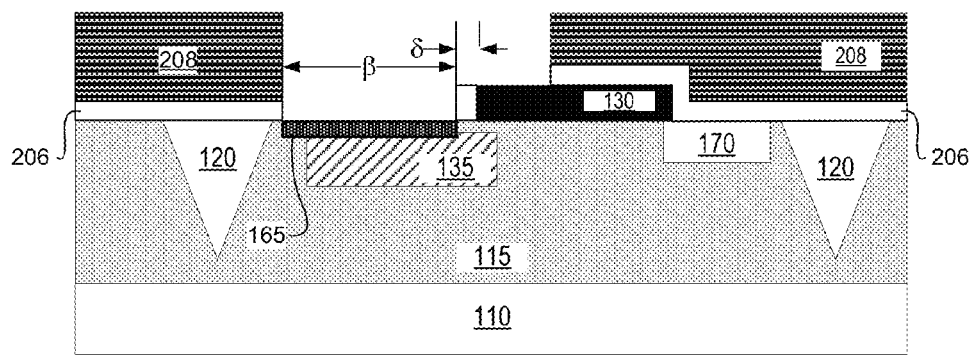

FIG. 2F illustrates a next part of the process. The result of the plasma doping within the plasma chamber is the formation of pinning layer 165 of width β in the part of epi layer 115 between photosensitive region 135 and surface 202. Pinning layer 165 is laterally spaced apart from the edge of transfer gate 130 by substantially the width δ of spacer 210. In an embodiment without counter-doping, plasma doping also results in formation of a doped area (not shown) in top surface 204b of transfer gate 130, but in an embodiment with counter-doping this doped area is neutralized or reduced by the prior counter-doping.

Figure 2G:
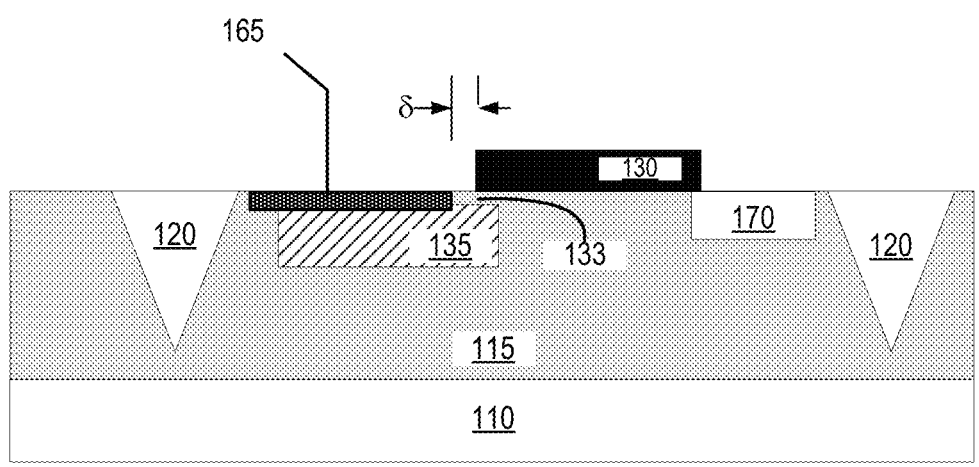

FIG. 2G illustrates a last part of the process. Beginning with the buildup shown in FIG. 2F, the remaining photoresist 208 and, if applicable, whatever re-mains of sacrificial layer 206 and sacrificial spacer 210, are stripped away, leaving be-hind a pixel in which transfer gate 130 is separated by a well-defined distance δ from the pinning layer 165 and the photosensitive region 135.

The above description of illustrated embodiments of the invention, including what is described in the abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

The terms used in the following claims should not be construed to limit the invention to the specific embodiments disclosed in the specification and the claims. Rather, the scope of the invention is to be determined entirely by the following claims, which are to be construed in accordance with established doctrines of claim 1nterpretation.

The invention claimed is:

1. A process comprising:
    forming a photosensitive region near a surface of a substrate;
    forming a transfer gate on the surface of the substrate adjacent to the photosensitive region, the transfer gate including a top surface and a pair of sidewalls;
    depositing a sacrificial layer on the surface of the substrate over the photosensitive region, on the top surface of the transfer gate, and at least the sidewall of the transfer gate closest to the photosensitive region, the sacrificial layer having a selected thickness;
    depositing a layer of photoresist over the sacrificial layer;
    patterning and etching the layer of photoresist and the sacrificial layer to expose the surface of the substrate over the photosensitive region and at least part of the top surface of the transfer gate while leaving the sacrificial layer on the sidewall of the transfer gate closest to the photosensitive region to form a sacrificial spacer;
    plasma doping the substrate to form a pinning layer between the photosensitive region and the surface of the substrate; and
    stripping the photoresist layer and the sacrificial spacer to expose the sidewall of the transfer gate closest to the photosensitive region, the spacing between the pinning layer and the sidewall of the transfer gate closest to the photosensitive region substantially corresponding to a thickness of the sacrificial spacer.

2. The process of claim 1 wherein the sacrificial layer is a polymer.

3. The process of claim 1 wherein the thickness of the sacrificial spacer is substantially equal to the selected thickness of the sacrificial layer.

4. The process of claim 2 wherein the sacrificial layer is a bottom anti-reflective coating (BARC).

5. The process of claim 4 wherein the BARC is an organosiloxane-based coating or a chromophoric polymer.

6. The process of claim 1 wherein plasma doping comprises using a Plasma Immersion Ion Implantation (PIII) process.

7. The process of claim 1, further comprising counter-doping at least a portion of the top surface of the transfer gate.

8. An apparatus produced according to a process comprising:
    forming a photosensitive region near a surface of a substrate;
    forming a transfer gate on the surface of the substrate adjacent to the photosensitive region, the transfer gate including a top surface and a pair of sidewalls;
    depositing a sacrificial layer on the surface of the substrate over the photosensitive region, on the top surface of the transfer gate, and at least the sidewall of the transfer gate closest to the photosensitive region, the sacrificial layer having a selected thickness;
    depositing a layer of photoresist over the sacrificial layer;
    patterning and etching the layer of photoresist and the sacrificial layer to expose the surface of the substrate over the photosensitive region and at least part of the top surface of the transfer gate while leaving the sacrificial layer on the sidewall of the transfer gate closest to the photosensitive region to form a sacrificial spacer;
    plasma doping the substrate to form a pinning layer between the photosensitive region and the surface of the substrate; and
    stripping the photoresist layer and the sacrificial spacer to expose the sidewall of the transfer gate closest to the photosensitive region, the spacing between the pinning layer and the sidewall of the transfer gate closest to the photosensitive region substantially corresponding to a thickness of the sacrificial spacer.

9. The apparatus of claim 8 wherein the sacrificial layer is a polymer.

10. The apparatus of claim 8 wherein the thickness of the sacrificial spacer is substantially equal to the selected thickness of the sacrificial layer.

11. The apparatus of claim 10 wherein the sacrificial layer is a bottom anti-reflective coating (BARC).

12. The apparatus of claim 11 wherein the BARC is an organosiloxane-based coating or a chromophoric polymer.

13. The apparatus of claim 8 wherein plasma doping comprises using a Plasma Immersion Ion Implantation (PIII) process.

14. The apparatus of claim 8, further comprising counter-doping at least a portion of the top surface of the transfer gate.

* * * * *